United States Patent [19]

Metz, Jr. et al.

[11] Patent Number: 4,584,027

[45] Date of Patent: Apr. 22, 1986

[54] TWIN WELL SINGLE MASK CMOS PROCESS

[75] Inventors: Werner A. Metz, Jr.; Hubert O. Hayworth, both of Fort Collins, Colo.

[73] Assignee: NCR Corporation, Dayton, Ohio

[21] Appl. No.: 669,275

[22] Filed: Nov. 7, 1984

[51] Int. Cl.[4] .................. H01L 7/54; H01L 21/265
[52] U.S. Cl. ........................... 148/1.5; 29/571;
29/576 B; 29/578; 148/187; 148/DIG. 82;
357/42; 357/91
[58] Field of Search ............ 148/1.5, 187; 29/576 B,
29/578, 571; 357/42, 91

[56] References Cited

U.S. PATENT DOCUMENTS

| | | | |
|---|---|---|---|
| 4,376,658 | 3/1983 | Sigusch | 148/1.5 |
| 4,399,605 | 8/1983 | Dash et al. | 29/571 |
| 4,411,058 | 10/1983 | Chen | 29/571 |
| 4,442,591 | 4/1984 | Haken | 29/571 |
| 4,470,191 | 9/1984 | Cottrell et al. | 29/576 B |
| 4,509,991 | 4/1985 | Taur | 148/1.5 |
| 4,516,316 | 5/1985 | Haskell | 29/576 B |

OTHER PUBLICATIONS

Terman IBM-TDB, 23 (1984) 427.
Ogura et al., IBM-TDB, 27 (1984) 722.
Yachi et al., "A New Field Isolation Technology Employing Lift-Off Patterning of Sputtered SiO$_2$ Films", *IEEE Transactions on Electron Devices*, vol. ED-31, No. 12, Dec. 1984, pp. 1748-1752.
Harper, "A Procedure for Field Implanting a CMOS Isoplanar Integrated Circuit", *IEEE Transactions on Electron Devices*, vol. ED-32, No. 3, Mar. 1985, pp. 720-722.

*Primary Examiner*—Upendra Roy
*Attorney, Agent, or Firm*—Wilbert Hawk, Jr.; Casimer K. Salys

[57] ABSTRACT

A twin-well process is formed using a single mask and lift-off techniques. The single implant mask is formed and the first well implanted followed by the deposition of a low temperature CVD film and the application of lift-off techniques to remove the mask and the overlying CVD film. The remaining portions of the CVD film provide a second mask which is self-aligned with and is the complement of the original mask. A second implantation then forms the second well. Alternative approaches using a photoresist mask and a composite nitride-photoresist mask structure are disclosed.

13 Claims, 9 Drawing Figures

TWIN WELL SINGLE MASK CMOS PROCESS

BACKGROUND OF THE INVENTION

This invention relates to a process for forming double-well, self-aligned regions in semiconductor substrates. In particular, the present invention relates to a one-photolithographic-mask process for forming close-packed self-aligned wells which are particularly useful in CMOS integrated circuits. In addition to the use of only a single photolithographic mask, the process is characterized in that a relatively simple lift-off technique is used to remove the single photolithographic mask to thereby form a doping mask for the second well which is the complement of the photolithographic mask. The process is further simplified by the use of preferential oxide etching as an adjunct to the lift-off.

Single wells or tubs (either n-type or p-type) are formed in opposite conductivity-type bulk semiconductor substrates or epitaxial layers (p-type or n-type), to provide the required opposite conductivity-type substrate surface-adjacent regions for the p-channel and n-channel transistors which are used in CMOS technology. The advantages to CMOS IC of using multiple-well structures are well-known. These include the control of substrate conductivity and of doping levels, and the potential for accurate dimensional control and decreased device size and the resulting increase packing density and speed. These and other advantages are discussed, for example, in Chen, QUADRUPLE-WELL FOR VLSI TECHNOLOGY, *IEEE Transactions on Electron Devices*, Vol. ED-31, No. 7, July 1984, pp 910-919. Accordingly, the advantages need not be discussed at length here. It is sufficient to note that among the issues which are of paramount importance at present are the need to decrease the latch-up phenomenon and the need to increase the relatively low CMOS packing density (relative to NMOS technology). Packing density would be increased by decreasing the large lay-out space which is required to form the opposite conductivity regions for the n-channel and p-channel transistors.

Chen, U.S. Pat. No. 4,411,058, issued Oct. 25, 1983 describes a process for forming self-aligned CMOS well structures. Chen forms a double retrograde, quadruple-well CMOS structure. Essentially, the structure is a two-well structure in which deep n-type and p-type wells are separated by shallow n-type and p-type wells which form channel stops. The shallow wells are implanted through a peripheral field oxide during the deep well implantation. Overall, the Chen process involves forming deep-well windows in a planar field oxide; defining a photoresist mask covering the p-well region and implanting phosphorous in the presence of the mask to define the deep n-well and the adjacent shallow n-well under the oxide; depositing aluminum on the existing structure; and lifting off the aluminum and the underlying masking material from over the p-well region, to define the remaining aluminum as a dopant mask for the implantation of the deep and shallow p-type wells. The resulting boundaries of the deep and shallow wells are self-aligned at the edge of the field oxide. In addition, the two shallow wells are mutually self-aligned by the aluminum mask.

According to Chen '058 patent, photoresist alone does not give the requisite lift-off to the overlying metal. Thus, a composite mushroom-shaped mask must be used. This, however, introduces process and structural complexities. In one embodiment, the composite mask comprises two layers of photoresist. The upper layer of photoresist is formed with a lip by over-etching the bottom layer.

In an alternative, preferred embodiment, the bottom mask layer is polysilicon. Again, this lower layer is over-etched to form the protruding over-layer of photoresist which is necessary for proper lift-off of the metal. In addition, the poly is not dissolved by the lift-off and requires a separate etch and the use of an underlying oxide etch-stop layer.

The above referenced Chen article, which was published after the development of the present invention, also describes a process for forming a quadruple-well CMOS structure comprising deep n-type and p-type wells and intervening, shallow well channel stops. The Chen article references the aluminum lift-off step which uses a "mushroom type" resist. Although the focus of the Chen article is directed to the operating characteristics of the resulting circuit (details of the lift-off process are not included), it is quite apparent that the Chen article references the same process as the Chen '058 patent and is affected by the same structural and process complexity.

It is an object of the present invention to provide a single-mask double-well fabrication process which is also characterized by process simplicity.

It is another object of the present invention to provide a double-well fabrication process which permits precise dimensional and doping level control of the wells.

SUMMARY OF THE INVENTION

In one aspect, the present invention is a twin-well substrate process in which an implantation mask structure is formed; the first well is implanted; a dielectric film is deposited using a suitable technique such as sputtering, plasma, electron beam, or photodeposition, at a deposition temperature which is below the flow point of the mask structure; the first mask structure and the overlying portions of the dielectric layer are removed to form a second mask which is the complement of, and is self-aligned with the original mask; then a second implantation is made to form the second well, followed by thermal drive-in of the wells.

In an additional aspect, the first well may be partially driven-in prior to deposition of the second well.

In another aspect, the thermal drive-in may be performed in an oxidizing ambient to form an alignment step for subsequent masking operations.

In one specific aspect, the invention is embodied in a process for forming a self-aligned twin-well structure which comprises: providing a substrate layer of predetermined conductivity type; forming a first mask of photoresist on a substrate which is a complement of a first well region; depositing selected impurities in the first well region in the presence of the mask; depositing an oxide layer on the resulting structure, including the mask and first well regions, using a deposition temperature which is below the flow point of the first mask; etching the oxide layer to accentuate the etching of the stressed oxide over outside corners of the first mask, then removing the first mask and the overlying regions of the oxide layer using a mask solvent so as to pattern the remaining oxide into a second mask which defines a self-aligned second well region; and depositing impurities in the second well in the presence of the second mask, using impurities of the opposite conductivity type to the first well.

In another specific aspect, the invention is embodied in a process for forming a self-aligned twin-well structure which comprises: providing a substrate layer of predetermined conductivity type; forming a first mask of a nitride layer and an outer photoresist layer on the substrate, which mask is the complement of a first well region; depositing selected impurities in the first well region in the presence of the mask; removing the photoresist layer and depositing an oxide layer on the resulting structure, including the mask and first well regions, using a deposition temperature which is below the flow point of the existing nitride layer mask structure; etching the oxide layer to accentuate the etching of the stressed oxide over outside corners of the nitride layer, then removing the nitride layer and the overlying regions of the oxide layer so as to pattern the remaining oxide into a second mask which defines a self-aligned second well region; and depositing impurities in the second well in the presence of the second mask, using impurities of the opposite conductivity type to the first well. Alternatively, the photoresist can be removed prior to the first impurity deposition step so that the nitride alone serves as the deposition mask.

BRIEF DESCRIPTION OF THE DRAWINGS

The above and other aspects of the present invention are discussed in detail with respect to the attached drawings in which:

FIGS. 1A through 3A are cross-sectional views in the manner of FIGS. 1 through 3 illustrating corresponding steps of an alternative embodiment of the present invention.

DETAILED DESCRIPTION OF THE INVENTION

The present invention uses lift-off techniques to form a pair of self-aligned wells or tubs for CMOS or other integrated circuit structures. The critical aspects of the invention relate to the process itself and to the complementary processing characteristics which are required in order to (1) apply a first mask which is the complement of the initial well and which is removable from the substrate using lift-off techniques, and then (2) apply a second, overlying mask and cleanly remove the second mask by lift-off of the first mask, to thereby define the second well as the complement of the first. The associated single photolithographic mask process is characterized by relative process simplicity, as described below.

Figure 1:
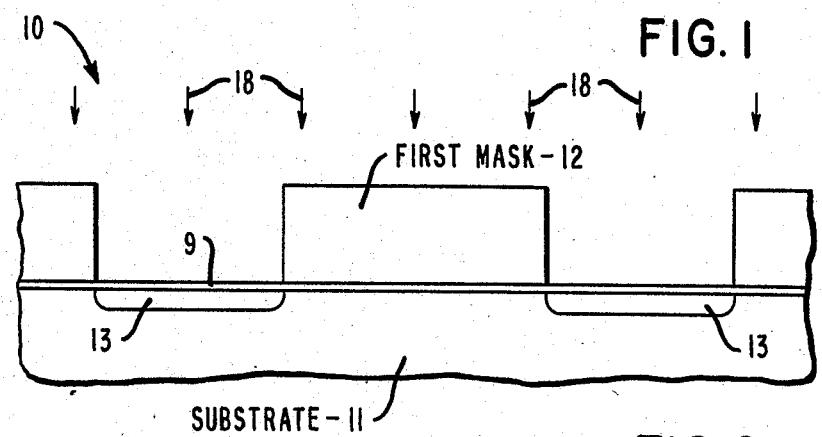
FIGS. 1 through 5 are cross-sectional views of a portion of a semiconductor substrate taken sequentially during the course of forming the self-aligned twin-well structures of the present invention.

Referring now to FIG. 1, the starting structure typically is an unpatterned n− bulk silicon substrate 11 or an n− epitaxial layer of <100> orientation which has a resistivity of one to 20 ohm-centimeters. Initially, an optionally, a protective layer 9 of silicon dioxide is grown on the substrate. The layer 9 prevents substrate contamination during subsequent processing. The layer 9 can be formed about 35 to 60 nanometers thick, using thermal oxidation in an oxidizing ambient at between about 900°–1100° C.

Next, an implantation mask 12 is formed which is the complement of the subsequently-formed first well. The mask 12 can be formed using conventional ultraviolet photolithographic techniques. Typical steps include the application of photoresist, exposure to ultraviolet radiation in the presence of a mask, followed by developing of the photoresist. Alternatively, other masking techniques such as electron beam or X-ray techniques may be used.

Referring further to FIG. 1, next the first-well region 13 is formed by depositing impurities 18 through openings in mask 12. Preferably, this predeposition step is done using ion implantation. However, furnace diffusion can be used if mask 12 is of the appropriate material for the temperature. A typical ion implantation sequence for forming an n− phosphorus well implant region 13 in a p− substrate 11 involves ion implantation of phosphorus at 125 KeV and a dose of $2.5 \times 10^{12}$ ions per cm$^2$. Of course, other n-type impurities such as arsenic and antimony can be used.

Figure 2:
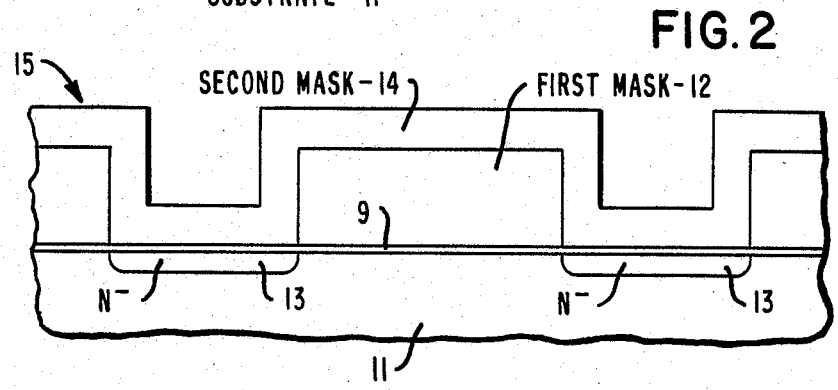

Next, and referring to FIG. 2, a second masking layer 14 is formed on the integrated circuit structure 10 of FIG. 1, over both first mask 12 and the well implant region 13. The deposition temperature for the mask 14 must be below the flow point of the first mask 12. The flow point of photoresist is about 160° to 180° C. Consequently, when photoresist is used as the first mask 12, a low temperature CVD dielectric film is conveniently used to form second masking layer 14. In the presently preferred embodiment, a low temperature, conformally deposited, plasma oxide is used for layer 14. In one example, the silicon oxide mask 14 is formed to a thickness of 300 to 500 nanometers using SiH$_4$/N$_2$/O/O$_2$ and a temperature of about 50° to 125° C. The resulting overlapping two-mask-layer structure 15 is shown in FIG. 2.

Figure 3:
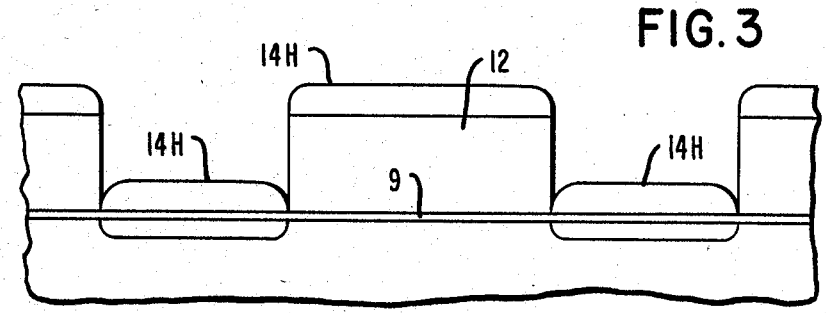

Next, lift-off techniques are applied to the structure 15 of FIG. 2 to remove the first mask 12 and the portions of the second masking layer 14 which overlie mask 12. Initially advantage is taken of the preferential etch rate of stressed plasma oxide over outside corners and vertical sidewalls of the mask 12 when using a wet buffered HF etchant. One approach for preferential etching is disclosed in Kurosawa et al, *A NEW BIRD'S BEAK-FREE FIELD ISOLATION TECHNOLOGY FOR VLSI DEVICES*, IEDM-81, pp 384–387. Essentially, Kurosawa discloses the cutting of grooves in the oxide along the sidewalls of a trench structure using a buffered HF solution. In the present preferential etch technique, the HF etchant has very good selectivity for the vertical sidewall portions/sections of the oxide layer 14, about (10–100):1 relative to the horizontal oxide sections, such as 14H, FIG. 3. Thus, the vertical sidewall oxide sections are grooved and removed, leaving the horizontal sections 14H intact.

In the present process, after application of the preferential oxide etch to remove the oxide 14 along the vertical walls of mask 12, the photoresist 12 is removed with a solvent, such as being dissolved by the application of ultrasonically agitated acetone. The portions of the plasma layer 14 overlying the photoresist 12 are lifted off along with the photoresist, thereby forming the layer 14 into a second mask 14H which is the self-aligned complement of the first mask 12. That is, and referring to FIG. 4, the second mask 14H and well opening 17 are automatically aligned with well regions 13.

Figure 4:
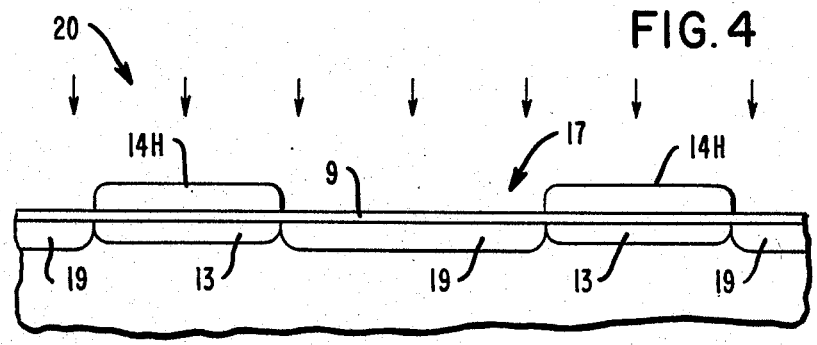

Next, impurities which are the opposite conductivity type to the first well 13 are introduced. Typically, this is done using ion implantation. Again, however, furnace diffusion can be used if the integrity of mask 14H can be maintained at the furnace temperature. One suitable ion implant action procedure uses boron, energy of 60 KeV and a dose of $2.5 \times 10^{12}$ ions per cm$^2$. As shown in FIG. 4, the resulting structure 20 includes a first n-well implant region 13 and a second p-well implant region 19.

Figure 5:
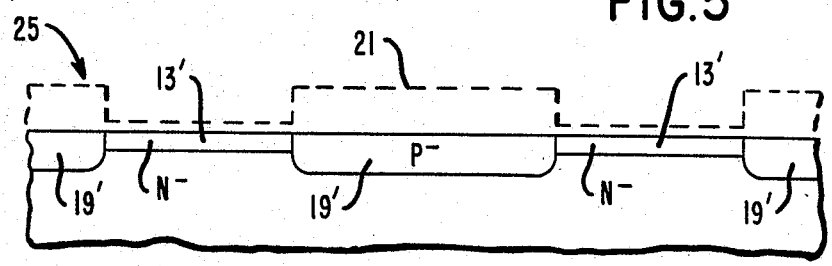

The implants are next driven in sufficiently to form wells using a single heating cycle. For example, a furnace diffusion cycle of 1,000° to 1,200° C. is applied for a sufficient time, typically 10 to 15 hours, to drive in the n- and p-type regions to junction depths of approximately 5 micrometers. FIG. 5 illustrates the resulting structure 25 containing n-well 13' and p-well 19'.

In an alternative version of the above-described process, an underlying nitride layer is used in combination with the photoresist layer as the well implant mask for the first impurity species. The nitride is then used to form the second, complementary implant mask from the silicon oxide layer. This alternative form of the process allows the use of a higher temperature silicon oxide process, for example a plasma oxide formed at about 380° C. which is well above the flow point of the resist. This relatively higher temperature silicon oxide has the advantage relative to the above-described lower temperature oxide of more uniform etch rate, fewer pin holes and defects, and increased diffusion.

Figure 1A:
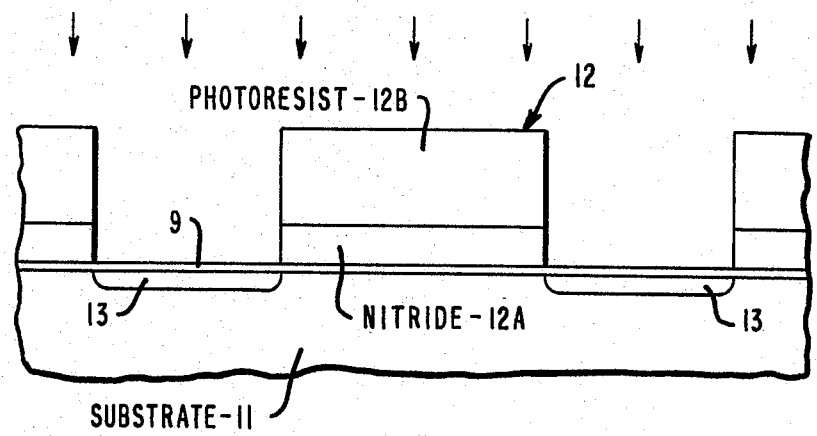

Referring to FIG. 1A, the alternative processing sequence commences as before, with the formation of the silicon oxide layer 9 about 35 to 60 nanometers thick on the substrate 11. As before, the silicon oxide 9 prevents contamination of the underlying substrate 11, principally from the photoresist chemicals, and implant ion created silicon surface damage. In addition, the oxide 9 functions to provide stress relief between the substrate and the silicon nitride layer 12A. In an exemplary embodiment, silicon nitride layer 12A is a CVD plasma nitride formed about 300 to 500 nanometers thick on the oxide using an NH$_3$/SiH$_4$ gas system. Next, and referring further to FIG. 1A, photoresist layer 12B is formed on the nitride to the same thickness used before, approximately one micrometer, and is defined into a mask as described previously. Then, using the photoresist 12B as an etch mask, the nitride is etched to complete masking structure 12. Preferably the etch involves the use of a dry nitride etch technique such as a mixture of SF$_6$ (90%) and O$_2$ (10%) in a parallel plate RIE system. The first-well layer 13 is then formed as shown in FIG. 1A by depositing n-type impurities, as described relative to FIG. 1, using the photoresist 12B and the nitride 12A as a composite mask.

Figure 2A:
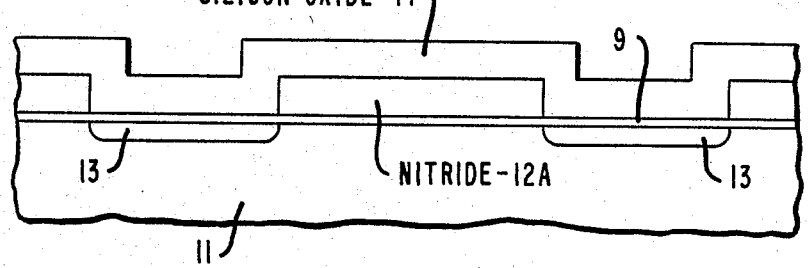

Referring to FIG. 2A, the photoresist layer 12B is removed by any one of various techniques, such as an oxygen plasma, or a "piranha" wet chemical resist strip using concentrated sulfuric acid and ammonium persulfate at about 120° C., or an ultrasonic acetone bath. Alternatively, the photoresist 12B can be removed prior to the first well 13 deposition. In this case, the silicon nitride 12A along serves as the deposition mask. The thickness of the nitride, of course, can be increased if necessary to accommodate particular deposition process parameters.

Next, the second mask layer 14 of silicon dioxide is formed to about the same thickness, approximately 300 to 500 nanometers, as used previously, employing in an exemplary approach a SiH$_4$/N$_2$O/O$_2$ plasma gas system at a temperature within the approximate range 350° to 450° C.

Figure 3A:
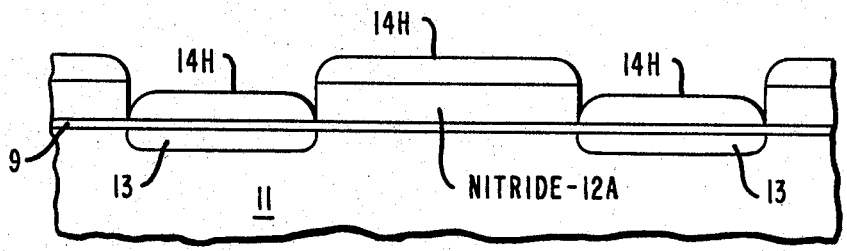

Thereafter, a wet buffered HF etchant is used, as discussed previously, to preferentially etch oxide over nitride outside corners and vertical sidewalls and thereby expose the vertical sidewall portions of nitride layer 12A, as shown in FIG. 3A. Lift-off of the nitride 12A and the overlying photoresist 14H is then accomplished by dissolving the nitride in a hot phosphoric acid solution at an exemplary temperature of about 150°–160° C.

After lift-off, the resulting structure is that shown in FIG. 4. That is, the remaining horizontal oxide sections 14H form the complementary mask which is the self-aligned complement of the first mask structure 12. The second mask 14H and the well opening 17 are formed in automatic alignment with the first mask openings associated with well regions 13. Thus, after lift-off, processing is continued as in the first-disclosed embodiment.

In other alternative aspects of the process sequence, a preliminary (partial) drive-in of the impurities of the first well region 13 may be used prior to the deposition of the second well region, that is, between the first-mask lift-off step and the second well deposition step. This preliminary drive-in can be used to compensate for differences in doping or diffusion depth levels. This optional step is particularly useful where the first-formed well uses relatively slow diffusing n-type dopants such as arsenic or antimony, to compensate for the slower diffusion rates of the n-type species. In still another alternative, the drive-in may be in an oxidizing ambient such as steam to preferentially oxidize the surface of the second well region 19 to provide a stepped alignment layer 21, as shown in phantom in FIG. 4. As an alternative, this well drive-in step may be used as part of the internal gettering process.

Figure 6:
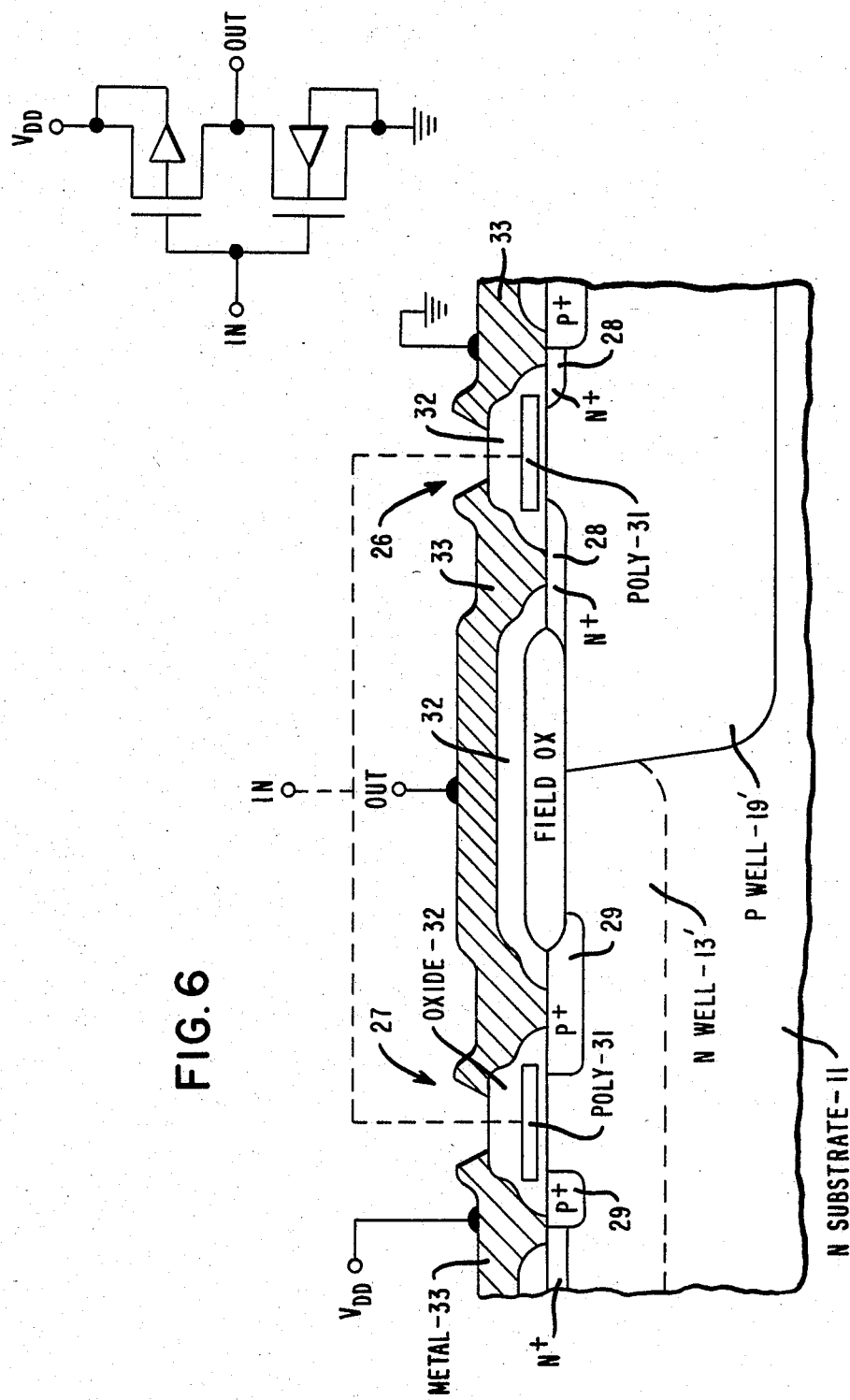
FIG. 6 is a cross-sectional view in the manner of FIGS. 1 through 5 illustrating a portion of a completed CMOS integrated circuit formed in the twin-wells of FIG. 5.

FIG. 6 illustrates a cross-section of a CMOS integrated circuit structure which is formed in the dual-well of FIG. 5. The illustrated CMOS structure includes a NMOS FET 26 and a PMOS FET 27 which are configured (connected) as an inverter and have respective source and drain diffusions 28 and 29 which are self-aligned with the polysilicon gates 31, an interlevel oxide dielectric layer 32 and aluminum interconnects 33. Quite obviously, this is only one possible application among the various NMOS, PMOS, CMOS, bipolar and other applications of the present dual-well structure and process.

Having this described preferred and alternative embodiments of the present invention, what is claimed is:

1. A process for forming a self-aligned twin-well structure comprising: providing a substrate layer of predetermined conductivity type; forming a first mask structure on the substrate which is the complement of a first well region; depositing selected impurities in the first region in the presence of the mask structure; depositing a relatively conformal dielectric layer on the resulting structure including the mask, a stressed dielectric layer over the mask sidewall, and first well region using a deposition temperature which is below the flow point of the existing first mask structure; selectively removing the stressed dielectric layer on the mask sidewall; removing the existing first mask structure and the overlying regions of the dielectric layer to form the dielectric layer into a second mask which defines a second well region self-aligned with and the complement of the first well; and depositing impurities in the second well in the presence of the second mask, using impurities of the opposite conductivity type to the first well.

2. The self-aligned twin-well process of claim 1 wherein the first mask is photoresist.

3. The self-aligned twin-well process of claim 1 wherein the first mask structure includes an outer layer of photoresist which is removed after the step of depositing impurities for the first well.

4. The self-aligned twin-well process of claim 1 wherein the first mask structure includes an inner, silicon nitride layer, and an outer, photoresist layer which is removed prior to the step of depositing impurities for the first well.

5. The self-aligned twin-well process of claim 1, 2, 3 or 4 wherein the first well is formed by ion implantation.

6. The self-aligned twin-well process of claim 1, 2, 3 or 4 wherein the dielectric layer is silicon oxide.

7. The process of claim 6 wherein selectively removing the oxide layer on the mask sidewall comprises etching the stressed sidewall oxide layer in buffered HF etchant, and is followed by a removal of the photoresist using ultrasonically agitated acetone to simultaneously remove the overlying oxide.

8. The self-aligned twin-well process of claim 3 wherein the first mask is formed by growing a stress relief oxide layer on the substrate, forming a layer of silicon nitride which serves as the first mask on the oxide layer, forming a photoresist layer on the silicon nitride and selectively removing corresponding portions of the layers.

9. The self-aligned twin-well process of claim 8 wherein the first mask removal step comprises etching the dielectric layer from the vertical sidewall sections of the silicon nitride using an HF etchant, then applying hot phosphoric acid to remove the nitride and overlying photoresist from the second well regions.

10. The self-aligned twin-well process of claim 1, 2, 3 or 4 wherein the secohd well is formed by ion implantation.

11. The self-aligned twin-well process of claim 7 wherein prior to the step of depositing the second well impurities, the structure is heated to drive in the first well impurities.

12. The self-aligned twin-well process of claim 8 or 9 wherein prior to the step of depositing the second well impurities, the structure is heated to drive in the first well impurities.

13. A process for forming a self-aligned twin-well structure comprising: providing a substrate layer of predetermined conductivity type; forming a first mask structure on the substrate comprising a first silicon nitride layer and an outer photoresist layer, which structure is the complement of a first well region; depositing selected impurities in the first well region in the presence of the mask; removing the photoresist layer; depositing a relatively conformal dielectric layer on the resulting structure including the silicon nitride, a stressed dielectric layer over the silicon nitride sidewall, and the first well regions using a deposition temperature which is below the flow point of the silicon nitride; selectively removing the stressed dielectric layer on the silicon nitride sidewall; removing the silicon nitride and the overlying regions of the dielectric layer to form the dielectric into a second mask which defines a second well region self-aligned with the complement of the first well; depositing impurities in the second well in the presence of the second mask, using impurities of the opposite conductivity type to the first well; and heating the structure to drive-in the well region impurities.

* * * * *